United States Patent [19]
Izumi et al.

[11] Patent Number: 5,635,220
[45] Date of Patent: Jun. 3, 1997

[54] MOLDING DIE FOR SEALING SEMICONDUCTOR DEVICE WITH REDUCED RESIN BURRS

[75] Inventors: Atsuhiko Izumi; Takehito Inaba; Kousuke Azuma, all of Tokyo, Japan

[73] Assignee: NEC Corporation, Tokyo, Japan

[21] Appl. No.: 530,425

[22] Filed: Sep. 19, 1995

[30] Foreign Application Priority Data

Sep. 22, 1994 [JP] Japan .................. 6-252740

[51] Int. Cl.⁶ .................. B29C 45/02; B29C 45/26
[52] U.S. Cl. .................. 425/116; 425/117; 425/544; 425/588; 425/DIG. 228; 264/272.17
[58] Field of Search .................. 425/116, 117, 425/121, 544, 588, DIG. 228, 573, 572; 264/272.17; 249/93, 95

[56] References Cited

U.S. PATENT DOCUMENTS

| | | | |
|---|---|---|---|
| 5,197,183 | 3/1993 | Chia et al. | 264/272.17 |
| 5,204,122 | 4/1993 | Konishi | 264/272.17 |

FOREIGN PATENT DOCUMENTS

| | | | |
|---|---|---|---|
| 52-43366 | 4/1977 | Japan | 264/272.17 |
| 54-33663 | 3/1979 | Japan | 264/272.17 |
| 63-228631 | 9/1988 | Japan | . |
| 64-47040 | 3/1989 | Japan | . |
| 2-9142 | 1/1990 | Japan | . |
| 2-186647 | 7/1990 | Japan | 264/272.17 |
| 4-142751 | 5/1992 | Japan | 264/272.17 |

*Primary Examiner*—Khanh P. Nguyen
*Attorney, Agent, or Firm*—Popham, Haik, Schnobrich & Kaufman, Ltd.

[57] ABSTRACT

A molding die for sealing a semiconductor element with a resin includes an upper and a lower mold half. A leadframe having a resin passage aperture is sandwiched between the lower mold half and the upper mold half. The lower mold half has a lower runner space, a lower cavity, and a lower gate provided between the lower runner space and the lower cavity. The upper mold half has an upper resin well, an upper cavity, and an upper gate provided between the resin well and the upper cavity. The length of the upper resin well in the direction of the flow of resin is equal to or greater than the distance from the lower gate to the front edge of a lower runner rising slope, to thereby obtain a final product which is free from resin burrs formed in the upper resin well.

5 Claims, 5 Drawing Sheets

000
MOLDING DIE FOR SEALING SEMICONDUCTOR DEVICE WITH REDUCED RESIN BURRS

BACKGROUND OF THE INVENTION

1. Field of the Invention

The present invention related to a molding die for resin sealing. More particularly, the present invention relates to a two-gate molding die for resin sealing in which gates are provided in an upper mold half and a lower mold half on the upper and lower sides of a leadframe, and a method of manufacturing a semiconductor device using the same.

2. Description of the Related Art

Conventional molding dies for resin sealing are of the single-gate type such as a lower-gate type in which a gate is provided below a leadframe, or an upper-gate type in which a gate is provided above a leadframe. However, single-gate type molding dies proved to have a disadvantage of non-filling of resin as the size of a chip and a package become larger and larger. Accordingly, instead of the single-gate molding die, two-gate molding dies have come to be widely adopted.

Molds having two gates are described in some literatures. Patent Publication No. JP-A-63-228631 discloses a molding die having two gates wherein the opening areas at the upper and lower gates are made substantially the same. Utility Model Publication No. JU-A-64-47040 discloses a molding die having two gates wherein an air vent is provided at one edge of a cavity. Patent Publication No. JP-A-2-9142 discloses a leadframe having a cut-away portion for connecting upper and lower gates with each other. Utility Model Publication No. JP-A-2-186647 also describes a molding die having upper and lower gates.

A conventional molding die which has two gates will be described with reference to FIG. 1, which shows a molding die together with a semiconductor chip sealed by resin. The molding die 200 for resin sealing is comprised of an upper mold half (or cope) 202 and a lower mold half (or drag) 201. The lower mold half 201 has a lower runner 204 extending horizontally for defining a lower runner space, a lower cavity 208 for molding, and a lower gate 206 provided between the lower runner space and the lower cavity 208 for separating them, with a resin passage or gate space being left therebetween. A pot 203 is formed at the front edge of the lower runner 204, and a lower runner rising slope 213 is formed between the lower runner 204 and the lower gate 206, the rising slope 213 rising in the direction of resin flow.

The upper mold half 202 has an upper resin well 215 for introducing resin, an upper cavity 209 for molding, and an upper gate 207 provided between the upper resin well 215 and the upper cavity 209 for separating them, with a resin passage or upper gate space being left therebetween. The upper resin well 215 is formed as a recess defined by an upper runner 205, an upper runner falling slope formed at the front edge of the upper runner 205 and an upper runner rising slope 212 formed at the rear edge of the upper runner 205.

The molding die 200 having the lower mold half 201 and the upper mold half 202 is heated to a desired temperature before receiving resin. The sealing resin 211 is held, in a molten state, due to the high temperature of the molding die, in the pot 203 of the lower mold half 201. After a leadframe 301 on which the semiconductor element 309 has been mounted and wire-bonded is disposed on the lower mold half 201, the upper mold half 202 is lowered so as to hold the leadframe 301 between the same and the lower mold half 201. Thereafter, a plunger (not illustrated) provided below the resin 211 is raised to force the molten resin 211 to flow in the direction designated by the arrows 1A, 2A, ..., 6A.

In detail, as a result of the upward movement of the unillustrated plunger provided below the resin, the resin 211 in the pot 203 flows along the lower runner 204 formed in the lower mold half 201 in the direction indicated by arrow 1A. The molten resin 211 then flows in the direction indicated by arrow 2A, at which the resin 211 is divided into an upper flow toward the upper gate 207 and a lower flow toward the lower gate 206. The upper flow of the resin 211 is allowed to pass through the resin passage aperture 308 formed in the leadframe 301.

The upper resin well 215 defined by the upper runner falling slope 214, the upper runner 205 and the upper runner rising slope 212, is generally designed such that the distance from the upper gate 207 to the front edge of the upper runner falling slope 214 is smaller than the distance from the lower gate 206 to the front edge of the lower runner rising slope 213, as illustrated in FIG. 1.

The resin flowing in the direction indicated by arrow 2A passes through a lower gate space formed between the lower gate 206 and the surface of the leadframe 301 and an upper gate space formed between the upper gate 207 and the surface of the leadframe 301, respectively, to enter the lower cavity 208 and the upper cavity 209, as indicated by arrows 3A and 4A. The resin flowing into the cavities 208 and 209 further flows in the directions indicated by arrows 5A and 6A toward air vents 210 which are formed to vent the air existing in the upper and lower cavities 208 and 209 before sealing to the outside of the mold. As a result, the cavities 208 and 209 are filled with resin for molding the semiconductor element.

The semiconductor element which has been subjected to the resin sealing process is taken out of the molding die after the completion of the molding process. At this time, the resin hardened in the upper resin well 215 is attached to the semiconductor element as a burr or flash. The burr should be removed in a subsequent burr removal process called degating. However, in some cases the burr remaining on the semiconductor element, is often fed to a subsequent tie-bar cutting process. In such a case, the burr falls off and is bitten by the tie-bar cutting die in the tie-bar cutting process, which causes damage to the tie-bar cutting die to stop the process.

Furthermore, in the conventional two-gate molding die, little attention has been paid to the height of the gate space, which is the distance from the surface of the leadframe to the gate, in the conventional molding die. Hence, it is difficult to obtain an equal flow rate of resin spreading into the upper and lower cavities, thereby causing a difference in charge rate of resin. The difference in charge rate between the cavities causes the resin to shift or deviate the island or the bonding wires, whereby the island or the bonding wires may be exposed at the surface of the resultant package.

SUMMARY OF THE INVENTION

In view of the foregoing, it is an object of the present invention to provide a two-gate molding die for resin sealing capable of removing burrs, which are formed due to residual resin in an upper resin well, with ease from a leadframe while preventing an island or lead of the leadframe from shifting to be exposed outside the package.

The present invention provides a molding die for resin sealing which comprises a first mold half and a second mold half. The first mold half has a first runner space communicated with a resin inlet, a first cavity, a first gate provided between the first runner space and the first cavity for separating with a resin passage left therebetween, and a first runner rising slope formed between the first gate and the first runner. The second mold half has a second cavity opposing the first cavity, a resin well, and a second gate opposing the first gate and formed between the second cavity and the resin well for separating them, with a resin passage left therebetween. The length of a flow path for resin in the resin well is designed to be equal to or longer than the length of a flow path for resin in the first runner rising slope, the flow path being viewed in the direction from the front side to the rear side of the molding die.

The present invention also provides a method of manufacturing a semiconductor device. The method includes the steps of: mounting a semiconductor element on a leadframe having a resin passage aperture; providing a first mold half having a first runner space communicated with a resin inlet at a front side thereof, a first runner rising slope formed at a rear side of said first runner space, a first cavity, a first gate formed between the first runner space and the first cavity, and a second mold half having a second cavity opposing the first cavity, a resin well, a second gate opposing the first gate and formed between the second cavity and the resin well; placing the leadframe between the first mold half and the second mold half such that the resin passage aperture is positioned between the first runner space and the resin well; and injecting molten resin into the first and second cavities via the first and second gates, and curing the resin so as to seal the semiconductor element, wherein the following relationship:

$$L > X \geq Y$$

is satisfied, where X, Y and L are the lengths of the resin well, the first runner rising slope, and the resin passage aperture, all the lengths being measured in the direction of flow of the resin.

In the present invention, by employing the configuration that the length of a flow path for resin in the resin well is designed to be equal to or longer than the length of a flow path for resin in the first runner rising slope as viewed in the direction from the front side to the rear side of the molding die, the burr formed by residual resin in the upper resin well, which is difficult to remove in a degating process in case of the conventional molding dies, can be substantially completely removed. Accordingly, the present invention prevents the resin burr from falling off and then being bitten by a tie-bar cutting die in the tie-bar cutting process subsequent to the degating process, which makes it possible to avoid damage to the cutting die.

The above and other objects, features and advantages of the present invention will be more apparent from the following description considered with the accompanying drawings.

DESCRIPTION OF THE PREFERRED EMBODIMENT

Referring to FIGS. 2A through 2G, description will be given of a method for sealing a semiconductor device with resin using a molding die, according to an embodiment of the present invention.

Figure 1:
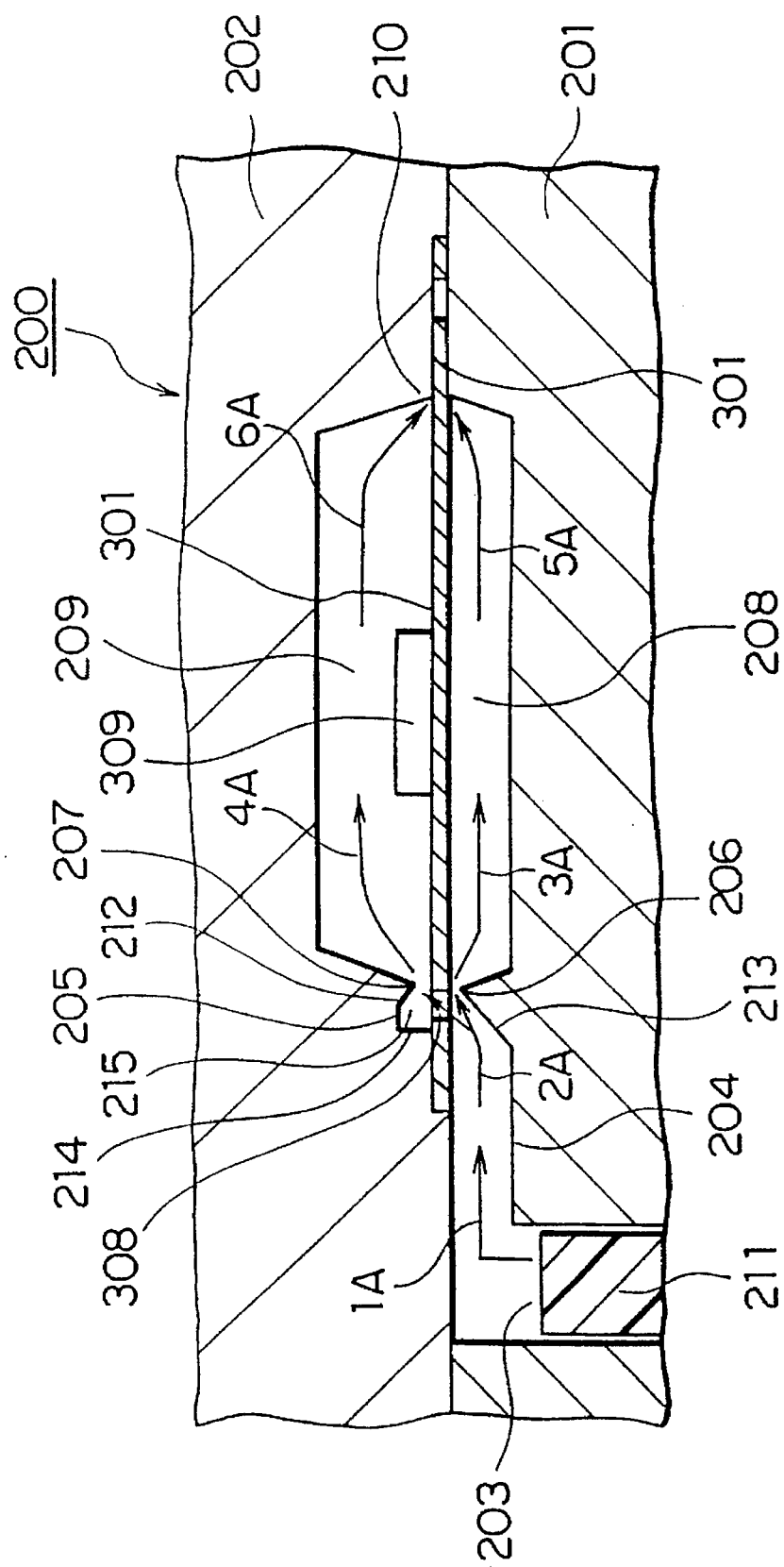
FIG. 1 is a sectional view of a conventional molding die for resin sealing at a step of sealing a semiconductor device.
Figure 2A:
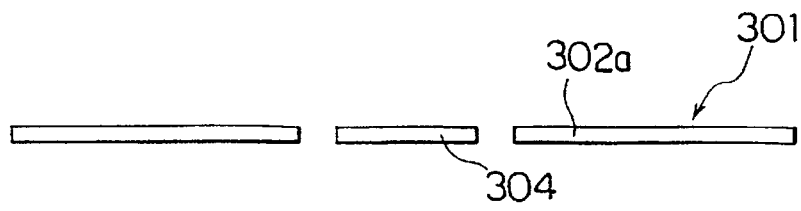
FIGS. 2A–2G are sectional views of consecutive steps of a method according to an embodiment of the present invention.
Figure 2B:
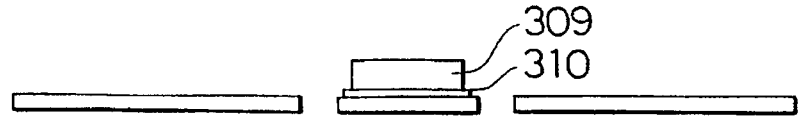
Figure 2C:
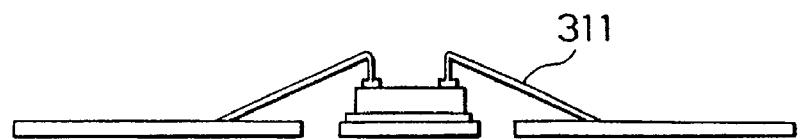
Figure 3:
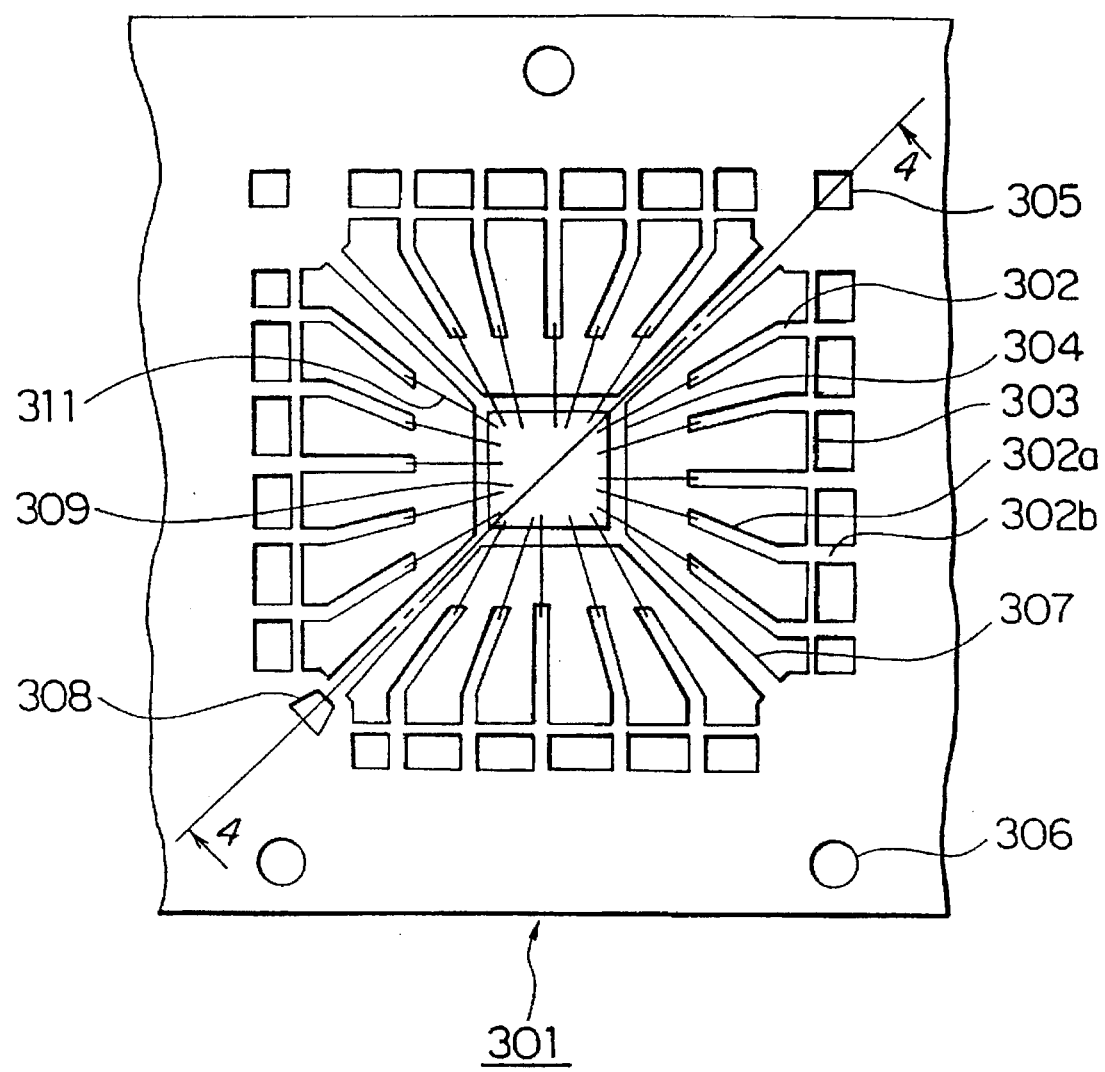
FIG. 3 is a plan view of a leadframe of a semiconductor device at a step of sealing a semiconductor device using a method according to an embodiment of the present invention.

As shown in FIG. 2A, a leadframe 301 having an island 304, inner leads 302a, etc., is first prepared. Then, as shown in FIG. 2B, a semiconductor element 309 is mounted on the island 304 of the leadframe 301 using Ag paste 310. Subsequent, as shown in FIG. 2C, bonding pads of the semiconductor element 309 and the inner leads 302a of the leadframe are connected together through bonding wires 311. FIG. 3 shows the semiconductor element and the leadframe at this stage in a plan view.

As shown in FIG. 3, the leadframe 301, which is made of 42-alloy, copper or a similar material and formed by etching or pressing, has the island 304 supported by suspension pins 307 at the central area of the leadframe 301, and leads 302 disposed so as to surround the island 304. The leads 302 include the inner leads 302a to which wires are bonded, and outer leads 302b. The leads 302 are tied together by a tie-bar 303 which also has a function to stop the flow of resin. Alignment holes 305 and 306 are formed in the leadframes 301, and a resin passage aperture 308 is also formed in the leadframe 301 to allow molten resin to flow therethrough during a step of resin sealing.

Figure 2D:
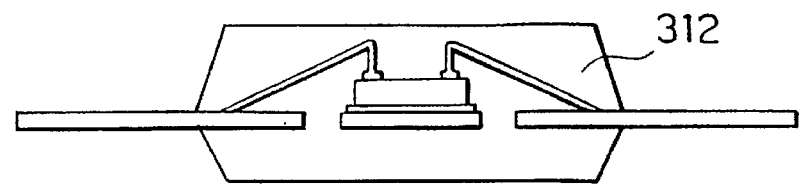
Figure 4:
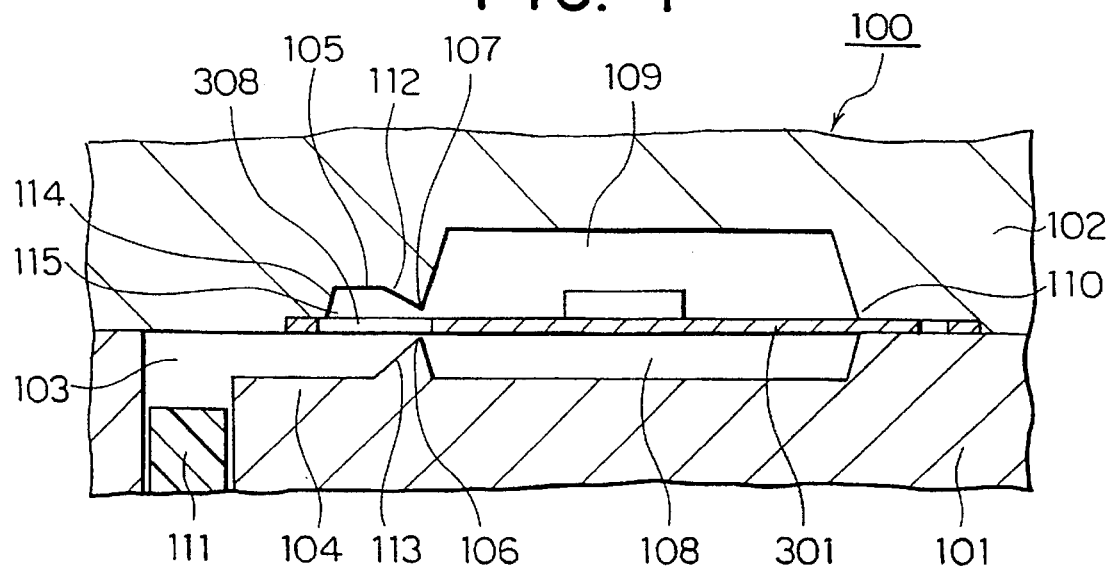
FIG. 4 is a sectional view taken in the direction of arrows 4–4 in FIG. 3, showing a molding die for resin sealing according to an embodiment of the present invention at the step of FIG. 2D.

Turning now to FIG. 2D, the leadframe 301 on which the semiconductor element 309 has been mounted is fed to a resin sealing step, in which the semiconductor element 309 and the bonding wires 311 are sealed by sealing resin 312. The sealing step will be described in detail with reference to FIG. 4 showing the lead frame 301 and the semiconductor element 309 together with a bonding die 100 according to an embodiment of the present invention. FIG. 4 is a cross section corresponding to line 4—4' in FIG. 3. The leadframe 301 is sandwiched between an upper mold half (cope) 102 and a lower mold half (drag) 101 of the molding die 100 after positioning of the leadframe 301 onto the lower mold half 101.

In FIG. 4, the molding die 100 for resin sealing comprises the upper mold half 102 and the lower mold half 101. The lower mold half 101 has a lower runner 104 extending horizontally for defining a lower runner space, a lower cavity 108 for receiving resin, and a lower gate 106 formed between the lower cavity 108 and the lower runner space for separating them, with a resin passage being left therebetween. A pot 103 is formed at the front edge of the lower runner 104, and a lower runner rising slope 113 is formed between the lower runner 104 and the lower gate 106. On the other hand, the upper mold half 102 has an upper resin well 115, an upper cavity 109, and an upper gate 107 provided between the upper cavity 109 and the resin well 115 for separating them, with a resin passage being left therebetween. The upper resin well 115 is a recess formed for introducing resin and defined by an upper runner 105, and an upper runner falling slope 114 and an upper runner rising slope 112 formed at both edges of the upper runner 105.

The upper gate 107 formed in the upper mold half opposes the lower gate 106 formed in the lower mold half 101. Air vents 110 are formed for the upper and lower cavities 109 and 108 at the far edges of the upper and lower cavities 109 and 108 opposite to the upper and lower gate 107 and 106 to vent the air in the cavities during a resin sealing process. In this embodiment, the length of the upper resin well 115 in the direction of the resin flow is larger than the distance from the front edge of the lower runner rising slope 113 to the lower gate 106. That is, the front edge of the upper runner falling slope 114 is located opposing the central portion of the lower runner 104 as viewed in the direction of the resin flow or the direction of the front side to the rear side of the molding die 100. Further, the resin passage aperture 308 is larger than the length of the upper resin well 115 in the direction of the resin flow. In the drawing, the front edge of the resin passage aperture 308 is located at the left side of the front edge of the upper runner falling slope 114.

These mold halves 101 and 102 are heated to a predetermined temperature before a sealing step, and the sealing resin 111 heated by the lower mold half 101 is held in the pot 103 formed in the lower mold half 101. After the leadframe 301 is positioned onto the lower mold half 101, the upper mold half 102 is lowered to clamp the leadframe 301 between the same and the lower mold half 101. Subsequently, a plunger (not illustrated) provided below the resin 111 is raised, whereby the molten resin 111 is pushed toward the cavities 108 and 109 through the gates 106 and 107.

Figure 5:
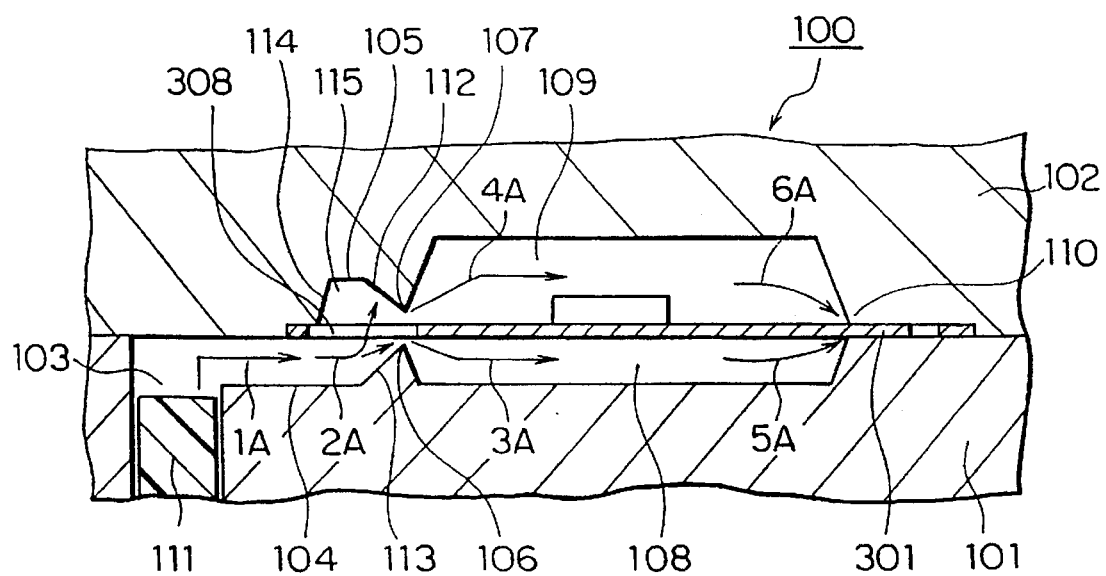
FIG. 5 is a sectional view for illustrating the flow of resin in the upper and lower mold halves of the molding die of FIG. 4.

Referring to FIG. 5 showing the flow of the resin in the molding die, the resin 111 pushed by the plunger first flows in the direction indicated by arrow 1A through the the lower runner space formed in the lower mold half 101. The resin 111 then flows in the direction indicated by arrow 2A toward the upper gate 107 and the lower gate 106.

The flow of the resin 111 is divided into a flow toward the upper gate 107 and a flow toward the lower gate 106, and the flow of the resin toward the upper gate 107 passes through the resin passage aperture 308 formed in the leadframe 301.

The resin 111 flowing in the direction indicated by arrow 2A passes through a lower gate space or gap between the lower gate 106 and the leadframe 301 and a higher gate space or gap between the upper gate 107 and the leadframe 301, respectively, so as to flow into the lower and upper cavities 108 and 109, as shown by arrows 3A and 4A. The resin 111 flowing in the directions indicated by arrows 3A and 4A then flows in the directions indicated by arrows 5A and 6A toward the air vent 110, as a result of which the inside of the cavities 108 and 109 are filled with the resin 111. Thereafter, the resin 111 is cured, and the sealing operation is completed.

Figure 2E:
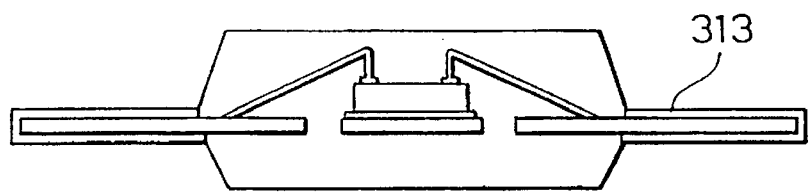

Turning to FIG. 2E, the semiconductor device thus sealed by the resin is taken out of the molding die and subjected to a degating process in which burrs formed on the package are removed. Thereafter, the tie-bars of the leadframe are cut off in a tie-bar cutting process, and the leads are coated with plating 313.

Figure 2F:
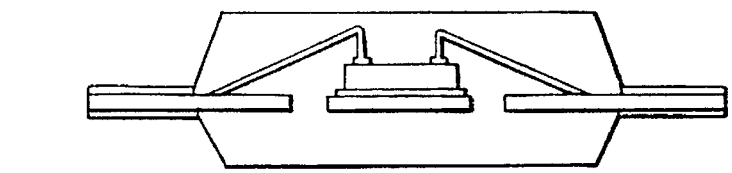
Figure 2G:
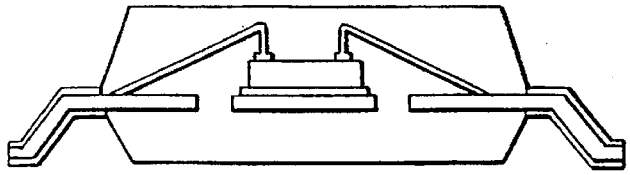

Subsequently, the leads are separated from the frame of the leadframe 301 by trimming, as shown in FIG. 2F, and the leads are formed into an appropriate shape by a forming machine, as shown in FIG. 2G, whereby a desired semiconductor device is obtained.

According to the present invention, molding dies are examined from the view point of burrs attached to the semiconductor device. In semiconductor devices formed by a conventional process using a conventional molding die, it is confirmed that burrs formed in the upper resin well are attached onto the surface of the packages after degating.

Table 1 shows the number of ICs having burrs left on the leadframe due to residual resin in the upper resin well after resin sealing was carried out for 200 ICs using the conventional mold.

TABLE 1

| Number of sealed ICs | Generation of burrs due to residual resin in upper well | |
|---|---|---|
| | Number of ICS having burrs | Ratio (%) |
| 200 | 112 | 56 |

Burrs formed by the upper resin well are examined for the semiconductor devices obtained from molding dies according to the present invention and from the conventional ones, while changing the length of the resin well.

Figure 6:
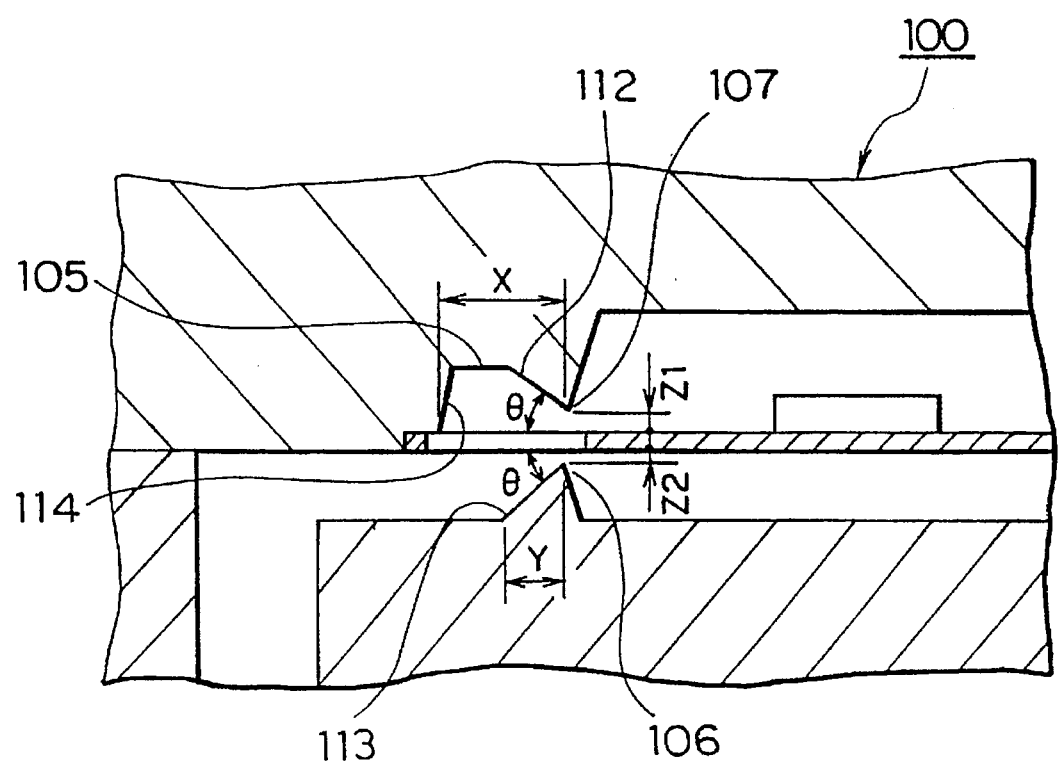
FIG. 6 is a sectional view for showing dimensions and angles in a molding die according to embodiments of the present invention.

Table 2 shows the number and ratio of ICs in each of which resin in the upper resin well 115 remained as a burr attached onto the leadframe 301. In table 2, X and Y represent the distance from the upper gate 107 to the front edge of the upper runner falling slope 114 and the distance from the lower gate 106 to the front edge of the lower runner rising slope 113, respectively, in the direction of resin flow as shown in FIG. 6.

TABLE 2

| | Number of sealed ICs | Generation of burrs due to residual resin in upper resin well | |
|---|---|---|---|
| | | Number of ICS having burrs | Ratio (%) |
| X < Y | 200 | 196 | 98 |
| X ≧ Y | 200 | 0 | 0 |

As shown in Table 2, when X<Y, burrs due to the residual resin in the upper resin well 115 were observed in substantially all of the leadframes. On the contrary, when X≧Y, no burrs remained on the leadframe 301. The results showed that the relationship X≧Y should be satisfied to avoid the remaining burrs attached onto the leadframe 301.

Resin sealing was performed using different resins having different moduluses of flexural elasticity. The results of the experiment showed that the sealing resin should have a modulus of flexural elasticity more than about 1200 kgf/cm$^2$ after the resin was cured.

TABLE 3

| Modulus of flexural elasticity (kgf/cm$^2$) | Number of sealed ICs | Generation of burrs due to residual resin in upper resin well | |
|---|---|---|---|
| | | Number of ICs having burrs | Ratio (%) |
| 1100 | 200 | 196 | 98 |
| 1250 | 200 | 0 | 0 |
| 1850 | 200 | 0 | 0 |

Resin sealing was performed while changing the sizes of the upper resin well 115 and the resin passage aperture 308. The results of the experiment showed that if the upper resin well 115 was larger than the resin passage aperture 308, it was difficult to remove the resin burr formed in the upper resin well 115 together with the resin burr formed in the lower gate 106 when the resin burr for the lower runner 104 was removed. That is, the resin burr for the upper resin well 115 remained on the leadframe 301. Therefore, it is preferable to make the upper resin well 115 smaller than the resin passage aperture such that the front edge of the falling slope is apart from the front edge of the resin passage aperture 308 at least 0.5 mm in the direction of the reverse of resin flow, taking account of the possible mismatch between the upper mold half 102 and the lower mold half 101 when they are clamped together.

Assuming that the upper gate space or gap between the leadframe 301 and the upper gate 107 is Z1, and that the gap between the leadframe 301 and the lower gate 106 is Z2, as shown in FIG. 6. The amount of shift and inclination of an island become smaller as the ratio of Z1 to Z2 comes closer to 1.00, as shown in Table 4. In this examination, it is preferable to set the ratio of Z1 to Z2 to a ratio in the range from 0.75 to 1.25, taking into consideration the amount of shift and the amount of island inclination which are allowable in resin sealing for resin sealed semiconductor devices.

TABLE 4

| Z1/Z2 | 0.30 | 0.50 | 0.75 | 1.00 | 1.25 |
| --- | --- | --- | --- | --- | --- |
| Averaged amount of island shift (mm) | 0.16 | 0.11 | 0.10 | 0.08 | 0.10 |
| Averaged amount of island inclination (mm) | 0.10 | 0.06 | 0.03 | 0.02 | 0.03 |

Moreover, resin sealing was carried out while changing the angle Θ between the leadframe and the slope of the gate portion (shown in FIG. 6). The results of the experiment are tabulated in Table 5, which shows that Θ should be equal to or smaller than 60°, taking the amount of island shift into consideration.

The maximum grain size of a filler contained in the sealing resin is 0.15 mm, and hence the height between the upper gate and the lower gate and the minimum width of the resin passage aperture are set to more than 0.2 mm.

TABLE 5

| Angle (θ) between leadframe and gate | Island shift (μm) | |
| --- | --- | --- |
| | Average | Standard deviation |
| 30° | 20 | 5 |
| 60° | 30 | 30 |
| 90° | 60 | 50 |

Since above embodiments are described only for examples, the present invention is not limited to such embodiments and it will be obvious for those skilled in the art that various modifications or alterations can be easily made based on the above embodiments within the scope of the present invention.

What is claimed is:

1. A molding die comprising a first mold half and a second mold half to be clamped together to sandwich a leadframe therebetween and to receive resin flowing in the direction from a front side to a rear side of said molding die, said first mold half having, successively in the direction of the resin flow, a resin inlet, a first runner for defining a first runner space communicated with said resin inlet at a front side of said runner, a first rising slope formed at a rear side of said first runner, a first gate formed at a rear edge of said first rising slope for defining a first gate space between said first gate and the leadframe, and a first cavity communicated with said first runner space through said first gate space, said second mold half having, successively in the direction of the resin flow, a resin well, a second rising slope formed at a rear side of said resin well, a second gate formed at a rear edge of said second rising slope for defining a second gate space between said second gate and the leadframe, and a second cavity communicated with said resin well through said second gate space, wherein, said first mold half and said second mold half are clamped together, said first gate and said first cavity are located opposite to said second gate and said second cavity, respectively, and wherein a length of said resin well taken in the direction of the resin flow is larger than a length of said first rising slope taken in the direction of the resin flow.

2. A molding die as defined in claim 1 wherein a ratio of a gap between said second gate and the leadframe to a gap between said first gate and the leadframe is between 0.75 and 1.25.

3. A molding die as defined in claim 1 wherein a gap between said first gate and said second gate is not lower than 0.2 mm.

4. A molding die as defined in claim 1 wherein said resin well is a recess defined by a second runner extending in the direction of the resin flow, with a falling slope and said second rising slope being formed at a front side and a rear side of said second runner, respectively.

5. A molding die as defined in claim 4 wherein both an angle between said leadframe and said first rising slope and an angle between said leadframe and said second rising slope are not larger than 60°.

* * * * *